(12) United States Patent
Otremba et al.

(10) Patent No.: US 9,806,029 B2
(45) Date of Patent: Oct. 31, 2017

(54) TRANSISTOR ARRANGEMENT WITH SEMICONDUCTOR CHIPS BETWEEN TWO SUBSTRATES

(71) Applicant: Infineon Technologies Austria AG, Villach (AT)

(72) Inventors: Ralf Otremba, Kaufbeuren (DE); Josef Hoeglauer, Heimstetten (DE); Chooi Mei Chong, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 801 days.

(21) Appl. No.: 14/044,232

(22) Filed: Oct. 2, 2013

(65) Prior Publication Data
US 2015/0092375 A1    Apr. 2, 2015

(51) Int. Cl.
*H05K 1/00* (2006.01)
*H05K 1/18* (2006.01)
(Continued)

(52) U.S. Cl.
CPC .... *H01L 23/5384* (2013.01); *H01L 21/02104* (2013.01); *H01L 23/4334* (2013.01); *H01L 23/49513* (2013.01); *H01L 23/49524* (2013.01); *H01L 23/49541* (2013.01); *H01L 23/49575* (2013.01); *H01L 24/33* (2013.01); *H01L 24/36* (2013.01); *H01L 24/40* (2013.01); *H01L 24/84* (2013.01); *H01L 23/3107* (2013.01); *H01L 2224/32245* (2013.01); *H01L 2224/4007* (2013.01); *H01L 2224/40095* (2013.01); *H01L 2224/40137* (2013.01); *H01L 2224/40245* (2013.01); *H01L 2224/48247* (2013.01); *H01L 2224/49171* (2013.01); *H01L 2224/73221* (2013.01); *H01L 2224/83192* (2013.01); *H01L 2224/92246* (2013.01); *H01L 2924/00014* (2013.01); *H01L 2924/13091* (2013.01); *H01L 2924/181* (2013.01); *Y10T 29/49105* (2015.01)

(58) Field of Classification Search
USPC .......................... 361/748, 767, 679.01, 720
See application file for complete search history.

(56) References Cited

U.S. PATENT DOCUMENTS 7,271,470 B1    9/2007  Otremba
7,936,048 B2 *  5/2011  Otremba ............... H01L 23/481
                                                    257/276

(Continued)

FOREIGN PATENT DOCUMENTS

CN    102099919 A    6/2011
CN    102915987 A    2/2013
(Continued)

Primary Examiner — Andargie M Aychillhum

(57) ABSTRACT

An electronic device comprising a first substrate, a second substrate, a first semiconductor chip comprising a transistor, comprising a first mounting surface bonded to the first substrate and comprising a second mounting surface bonded to the second substrate, and a second semiconductor chip comprising a first mounting surface bonded to the first substrate and comprising a second mounting surface bonded to the second substrate, wherein the first semiconductor chip comprises a via electrically coupling a first transistor terminal at its first mounting surface with a second transistor terminal at its second mounting surface.

20 Claims, 9 Drawing Sheets

(51) Int. Cl.
*H05K 7/00* (2006.01)
*H01L 23/538* (2006.01)
*H01L 21/02* (2006.01)
*H01L 23/00* (2006.01)
*H01L 23/433* (2006.01)
*H01L 23/495* (2006.01)
*H01L 23/31* (2006.01)

(56) References Cited

U.S. PATENT DOCUMENTS

| | | | |
|---|---|---|---|
| 2005/0275089 A1* | 12/2005 | Joshi | H01L 23/3107 |
| | | | 257/727 |
| 2007/0262346 A1 | 11/2007 | Otremba et al. | |
| 2008/0048342 A1 | 2/2008 | Cheah et al. | |
| 2009/0086454 A1* | 4/2009 | Sakamoto | H05K 1/144 |
| | | | 361/796 |
| 2011/0095367 A1 | 4/2011 | Su et al. | |
| 2012/0292745 A1 | 11/2012 | Park et al. | |

FOREIGN PATENT DOCUMENTS

| | | |
|---|---|---|
| DE | 102004018477 A1 | 11/2005 |
| EP | 1965619 A2 | 9/2008 |

\* cited by examiner

TRANSISTOR ARRANGEMENT WITH SEMICONDUCTOR CHIPS BETWEEN TWO SUBSTRATES

BACKGROUND OF THE INVENTION

Field of the Invention

The present invention relates to an electronic device, an electronic power device, and a method of manufacturing an electronic device.

Description of the Related Art

Power semiconductor chips may, for example, be integrated into electronic devices. Power semiconductor chips are suitable in particular for the switching or control of currents and/or voltages.

SUMMARY OF THE INVENTION

There may be a need to provide electronic devices with a high freedom of design.

According to an exemplary embodiment, an electronic device is provided which comprises a first substrate, a second substrate, a first semiconductor chip comprising a transistor, comprising a first mounting surface bonded to the first substrate and comprising a second mounting surface bonded to the second substrate, and a second semiconductor chip comprising a first mounting surface bonded to the first substrate and comprising a second mounting surface bonded to the second substrate, wherein the first semiconductor chip comprises a via electrically coupling a first transistor terminal at its first mounting surface with a second transistor terminal at its second mounting surface.

According to another exemplary embodiment, an electronic power device is provided which comprises a first substrate, a second substrate, a first semiconductor power chip comprising a first transistor, comprising a first mounting surface with two transistor terminals bonded to the first substrate and comprising a second mounting surface with one transistor terminal bonded to the second substrate, and a second semiconductor power chip comprising a second transistor, comprising a first mounting surface with two transistor terminals bonded to the first substrate and comprising a second mounting surface with one transistor terminal bonded to the second substrate, wherein, in a plan view perpendicular to the mounting surfaces, the second substrate covers the entire second mounting surface of the first semiconductor power chip and the entire second mounting surface of the second semiconductor power chip.

According to yet another exemplary embodiment, a method of manufacturing an electronic device is provided, wherein the method comprises bonding a first mounting surface of a first semiconductor chip to a first substrate, bonding a first mounting surface of a second semiconductor chip to the first substrate, bonding a second mounting surface of the first semiconductor chip to a second substrate, bonding a second mounting surface of the second semiconductor chip to the second substrate, and forming a via extending through the first semiconductor chip for electrically coupling a first transistor terminal at its first mounting surface with a second transistor terminal at its second mounting surface.

According to still another exemplary embodiment, a method of manufacturing an electronic power device is provided, wherein the method comprises bonding two transistor terminals at a first mounting surface of a first semiconductor power chip comprising a first transistor to a first substrate, bonding one transistor terminal at a second mounting surface of the first semiconductor chip to a second substrate, bonding two transistor terminals at a first mounting surface of a second semiconductor power chip comprising a second transistor to the first substrate, bonding one transistor terminal at a second mounting surface of the second semiconductor chip to the second substrate, and arranging the first substrate and the second substrate in relation to the first semiconductor chip and to the second semiconductor chip so that, in a plan view perpendicular to the mounting surfaces, the first substrate extends over the entire first mounting surface of the first semiconductor power chip and the entire first mounting surface of the second semiconductor power chip, and the second substrate covers the entire second mounting surface of the first semiconductor power chip and the entire second mounting surface of the second semiconductor power chip.

An exemplary embodiment has the advantage that, as a consequence of a chip-traversing via connection between different transistor terminals of one of the semiconductor chips to be connected between the two substrates of the electronic device, a wire bond for connecting these terminals can be omitted. This, in turn, allows for a reduction of the space consumption for the electronic device and therefore results in a compact design and a small footprint. The provision of a via at the mentioned semiconductor chip for coupling two transistor terminals (such as gate and source) allows to electrically contact this semiconductor chip without the need of a bond wire.

Design rules of a semiconductor chip technology may require a sufficient clearance between a substrate and a wire bond for contacting a semiconductor chip, so that the omission of a wire bond allows to implement a substrate which spatially extends beyond all semiconductor chip edges. Consequently, particularly a semiconductor chip having a via connection between two transistor terminals thereof has relaxed requirements concerning a maximum chip dimension and therefore an increased freedom of design. With the freedom to configure particularly this semiconductor chip sufficiently large, its performance may be increased and/or the dissipation of heat generated during operation of the electronic device may be simplified, since the heat can be dissipated over a larger surface of this semiconductor chip.

DESCRIPTION OF FURTHER EXEMPLARY EMBODIMENTS

In the following, further exemplary embodiments of the electronic device, the electronic power device and the methods will be explained.

In an embodiment, the first semiconductor chip comprises a third transistor terminal at its first mounting surface. The first transistor terminal and the third transistor terminal may be arranged parallel to one another at the first mounting surface, and may be spaced by a gap relative to one another. Hence, two of three transistor terminals may be arranged at the first mounting surface, whereas the third one may be arranged at the opposing second mounting surface. The latter transistor terminal may cover the entire second mounting surface.

In an embodiment, the first transistor terminal of the first semiconductor chip is a gate terminal, the second transistor terminal of the first semiconductor chip is a first source/drain terminal (i.e. a source terminal or a drain terminal), and the third transistor terminal of the first semiconductor chip is a second source/drain terminal (i.e. a source terminal or a drain terminal). One of the first and the second source/drain terminals is a source terminal, whereas the other one is a drain terminal.

In an embodiment, the transistor of the first semiconductor chip is an n-type transistor, its first transistor terminal is a gate terminal, its second transistor terminal is a source terminal, and its third transistor terminal is a drain terminal. Alternatively, the transistor is a p-type transistor. An n-type metal oxide semiconductor field effect transistor (MOSFET) may be preferred, since it can be provided in a compact way with a fast switching performance.

In an embodiment, the second semiconductor chip comprises a further transistor. The further transistor can be free of a via connection between two terminals thereof located on opposing mounting surfaces or main surfaces of the second semiconductor chip.

In an embodiment, the further transistor comprises a first transistor terminal and a second transistor terminal at its first mounting surface and a third transistor terminal at its second mounting surface. The first transistor terminal may be a gate terminal, the second transistor terminal may be a first source/drain terminal, and the third transistor terminal may be a second source/drain terminal.

The first transistor terminal and the second transistor terminal of the second semiconductor chip may be arranged parallel to one another at the first mounting surface, and may be spaced by a gap relative to one another, whereas the third one may be arranged at the opposing second mounting surface. The latter transistor terminal may cover the entire second mounting surface of the second semiconductor chip.

In an embodiment, the further transistor is an n-type transistor, its first transistor terminal is a gate terminal, its second transistor terminal is a source terminal, and its third transistor terminal is a drain terminal. Alternatively, the further transistor is a p-type transistor. An n-type metal oxide semiconductor field effect transistor (MOSFET) may be preferred, since it can be provided in a compact way with a fast switching performance.

In an alternative embodiment, the second semiconductor chip comprises a diode. An anode terminal of the diode may be bonded to the first substrate and a cathode terminal of the diode is bonded to the second substrate. In other words, the anode terminal and the cathode terminal of the diode may be located on opposing main surfaces of the second semiconductor chip.

In an embodiment, the electronic device is configured as a half bridge in which the transistor of the first semiconductor chip is configured as high-side switch and the second semiconductor chip comprises an assigned low-side switch. An example as to how a half bridge can be constituted is shown in FIG. 6.

In an embodiment, the first substrate comprises a leadframe having a plurality of electrically conductive connection elements for electrically connecting the first mounting surface of the first semiconductor chip and the second semiconductor chip (and therefore also electrically connecting the transistor terminals at the first mounting surfaces). By such a lead frame, the terminals of the semiconductor chips on their respective first mounting surface can be electrically connected to the electronic periphery, for instance a printed circuit board (PCB) on which the entire electronic device is to be mounted. A part of the lead frame may be overmolded together with the semiconductor chips for packaging purposes, whereas another part of the lead frame may extend out of such a molding structure so as to be bringable in contact with the electronic periphery. As an alternative to a lead frame, the first substrate may also be embodied as any other kind of rewiring or electric redistribution structure, for instance as a chip carrier.

In an embodiment, the second substrate is a bonding clip (which may for instance be connected in a cantilever fashion to the first substrate, for instance asymmetrically connected to the first substrate by a connection arm). Clip-bonding technology is an alternative to a wire-bond connection between semiconductor chips and a lead frame by a clip, and may be embodied for instance by a solid bridge (for instance of copper), which may be connected (for example soldered by solder paste) to the respective semiconductor chip and/or lead frame. This allows for a proper package resistance, an efficient thermal transfer, and a fast switching performance due to the compact package.

In an embodiment, the bonding clip is made of a thermally conductive and electrically conductive material, for instance copper. Such a selection ensures that the bonding clip not only provides for an electric connection between semiconductor chip(s) and the first substrate, but also efficiently contributes to the dissipation of heat generated during operation of the electronic device.

In an embodiment, the bonding clip covers the entire second mounting surface of the first semiconductor chip (and in particular may even extend beyond the entire circumference of the second mounting surface of the first semiconductor chip) and covers the entire second mounting surface of the second semiconductor chip (and in particular may even extend beyond the entire circumference of the second mounting surface of the second semiconductor chip). In other words, all exterior edges delimiting the second substrate may extend beyond edges of the first semiconductor chip and the second semiconductor chip. Thus, the edges of the semiconductor chips do not protrude laterally (i.e. in a plan view) over the second substrate in the described embodiment. When omitting a wire bond between the first semiconductor chip and the first substrate (particularly when embodied as a lead frame) by implementing an electrically conductive through chip via in the first semiconductor chip (compare the conventional architecture of FIG. 7 with the improved architecture according to FIG. 8), the omission of this wire bond makes it possible to increase the surface of the second substrate (particularly embodied as a bonding clip) which may therefore extend over the entire second mounting surfaces of both semiconductor chips. This makes it also possible to increase, if desired, the size of the first semiconductor chip which simplifies and improves the cooling capability of the electronic device.

In an embodiment, the first substrate (particularly when configured as a leadframe) extends over the entire first mounting surface of the first semiconductor chip and the entire first mounting surface of the second semiconductor chip. In other words, all exterior edges delimiting the first substrate may extend beyond edges of the first semiconductor chip and the second semiconductor chip. Thus, the edges of the semiconductor chips will not protrude laterally over the first substrate in the described embodiment.

In an embodiment, the semiconductor chips will not overlap with the respective substrate(s), but may particularly be completely embedded between the substrates.

In an embodiment, the electronic device is configured as a power device, and the first semiconductor chip and the second semiconductor chip are correspondingly configured as power chips (particularly as power transistors). The electronic devices may be used for power applications for instance in the automotive field. In one embodiment, the electronic device is configured as an engine control unit for controlling operation of a connected engine, such as a combustion engine or an electric engine. Therefore, the electronic device is capable for being used in the field of automated applications where one or more engines are implemented. For instance, the electronic device may be used for an automotive application such as the control of the drive engine or motor of a vehicle, a window lift motor of a vehicle, a drive engine of a centralized door locking system in a door of a vehicle, etc. In another embodiment, the electronic device may be capable of controlling an engine-driven machine tool such as a drilling machine, a bolt-firing tool, etc. In still another exemplary embodiment, the electronic device may also be capable of controlling an engine-free system, such as a vehicle lightning system or the like.

In an embodiment, the device comprises a driving unit (such as a microcontroller) mounted on the first substrate and configured for driving at least one of the first semiconductor chip and the second semiconductor chip. The driving unit may be electrically connected by wire bonding to at least one of the group consisting of the first semiconductor chip, the second semiconductor chip, and at least one electrically conductive pad on the first substrate. The at least one electrically conductive pad may extend at least partially out of the molding structure so as to be externally connectable to an electronic periphery of the electronic device. Thus, a compact design may be achieved.

In an embodiment, the electronic device is configured as at least one of the group consisting of a cascaded power stage, a half bridge, a multi-half bridge, an H-bridge, and an electric engine controller. However, many other applications are possible as well.

In an embodiment, the device further comprises at least a third semiconductor chip comprising a first mounting surface bonded to the first substrate and comprising a second mounting surface bonded to the second substrate. The third semiconductor chip may also have a transistor which may or may not have a via coupling a gate terminal to a source/drain terminal thereof. With the configuration of three semiconductor power chips, the provision of a cascaded power stage is possible.

In an embodiment, the device further comprises a third substrate, a third semiconductor chip comprising a first mounting surface bonded to the first substrate and comprising a second mounting surface bonded to the third substrate, and a fourth semiconductor chip comprising a first mounting surface bonded to the first substrate and comprising a second mounting surface bonded to the third substrate. The third semiconductor chip and/or the fourth semiconductor chip may also have a transistor which may or may not have a via for coupling a gate terminal to a source/drain terminal of the respective transistor. With the configuration of four semiconductor power chips, the provision of an H-bridge is possible. Two of the semiconductor chips may be mounted between the first substrate and the second substrate, whereas the other two of the semiconductor chips may be mounted between the first substrate and the third substrate. In such an embodiment, all three substrates may be embodied as lead frames.

In an embodiment, the device comprises a molding structure at least partially encapsulating at least the first semiconductor chip and the second semiconductor chip. In the context of the present application, the term "molding structure" may particularly denote a mold which can be supplied in a liquid or granulate form by depositing it over the semiconductor chips including part of its electric contact structures and which can be subsequently hardened or cured so that at least a part of the semiconductor chip surface and at least part of the electric contact structure surface is covered by the mold material. The molding structure may then form at least part of an exterior surface of the resulting electronic device. The mold material may be a plastic material, having, if desired or required, filler particles embedded therein for adjusting the material properties thereof (for instance for increasing the thermal conductivity). Such a molding not only mechanically fastens the various components to one another but also provides for a robust constitution of the semiconductor chips including its electric contact structures and can contribute also to the heat removal capability of the molding structure.

In an embodiment, any of the mentioned transistors may be a field effect transistor, particularly a metal oxide semiconductor field effect transistor (MOSFET). Other types of transistors may be used as well for certain applications, for instance bipolar transistors. Field effect transistors may be preferred for switching operations in view of their particularly fast switching performance.

In an embodiment, at least one of the first semiconductor chip and the second semiconductor chip is mounted to the first substrate by flip chip technology. In this context, the term "flip chip technology" means that one power electrode (such as a source electrode or a drain electrode) is arranged next to the gate electrode, i.e. on the same mounting surface of a power semiconductor chip including the field effect transistor, and that these two juxtaposed electrodes are mounted on the bottom substrate (particularly the first substrate, preferably configured as a lead frame) of the electronic device.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DETAILED DESCRIPTION OF EXEMPLARY EMBODIMENTS

Figure 1:
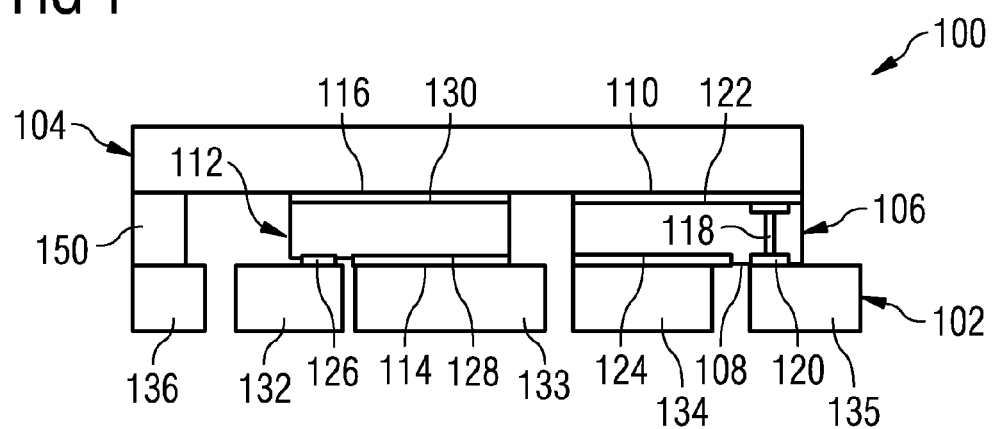
FIG. 1 shows a side view of an electronic device according to an exemplary embodiment configured as a flip chip power stage including a driver.

The illustration in the drawing is schematically and not to scale.

Before exemplary embodiments will be described in more detail referring to the figures, some general considerations will be summarized based on which exemplary embodiments have been developed.

By implementing a flip chip power stage, a large board-space reduction can be achieved. For instance, the flip chip power stage concept can reduce the achievable footprint down to 4×6 mm$^2$, or the maximum possible chip size can be increased by ~50% within the same footprint (6×6 mm$^2$).

An exemplary embodiment therefore provides a multi chip module with a common clip based on multiple flip chip technology. Such a multi chip module may be equipped with a common clip and a through silicon via. Such a multi chip module may, additionally or alternatively, be equipped with a common clip for power chips and an integrated driver circuit with a wire bond redistribution. Such a multi chip module equipped with a common clip may, additionally or alternatively, be configured as a multiple half bridge. A multi chip module according to an exemplary embodiment may, additionally or alternatively, be equipped with a common clip and a package top-side contact.

Based on such a multi chip module with common clip architecture in multiple flip chip technology, the maximum chip size of a high-side switch can be increased compared to standard gate contact by wire bonding.

Besides the opportunity of increased chip size this package concept of a common clip can also be used for more complex circuitries like cascaded power stage (for instance configured as a half bridge with one high-side switch and two low-side switches.

Figure 2:
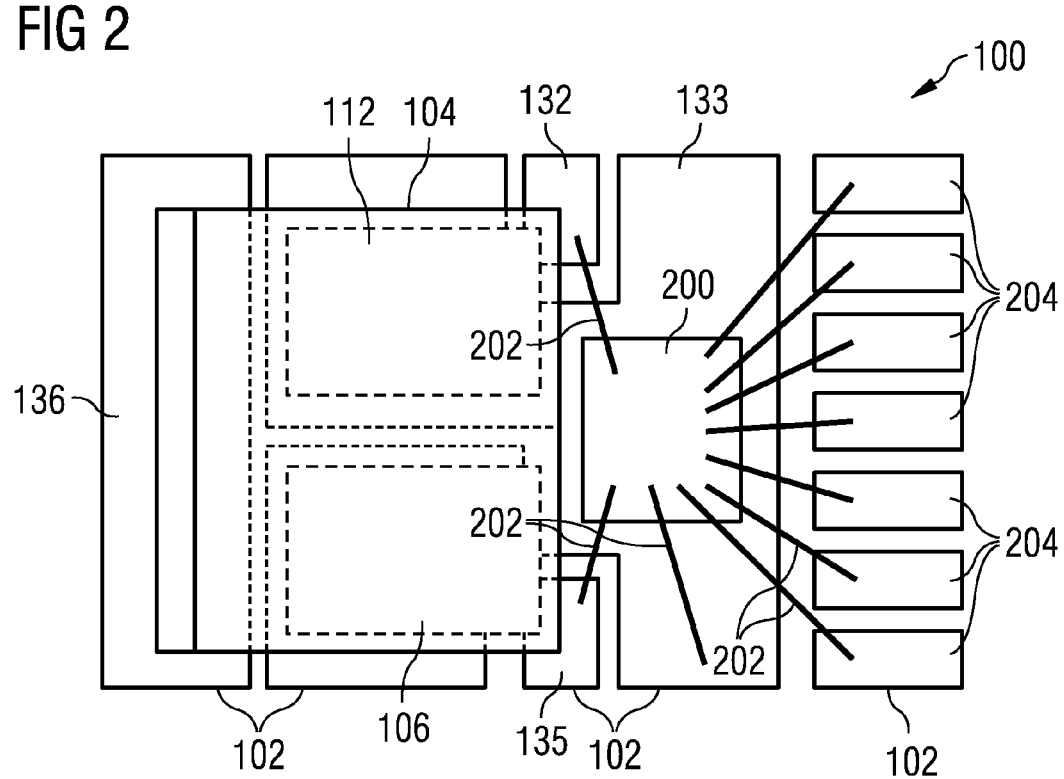
FIG. 2 shows a plan view of the electronic device of FIG. 1.

FIG. 1 shows a side view of an electronic device 100 according to an exemplary embodiment configured as a flip chip power stage. FIG. 2 shows a plan view of the electronic device 100 of FIG. 1 and in particular shows that the power stage includes a driver 200.

The electronic device 100 is configured as an electronic power device and comprises a first substrate 102 embodied as a lead frame, a second substrate 104 embodied as a bonding clip connected laterally to the first substrate 102 (see connection arm 150), a first semiconductor chip 106, and a second semiconductor chip 112.

The first semiconductor chip 106 is configured as a semiconductor power chip and comprises a field effect transistor. The first semiconductor chip 106 has a first mounting surface 108 (or main surface) bonded to the first substrate 102 and has a second mounting surface 110 (or main surface) bonded to the second substrate 104. The first semiconductor chip 106 also comprises an electrically conductive through silicon via 118 made of an electrically conductive material, extending vertically through the body of the first semiconductor chip 106 and electrically coupling a gate terminal as a first transistor terminal 120 at its first mounting surface 108 with a source terminal as a second transistor terminal 122 at its second mounting surface 110. The first semiconductor chip 106 comprises a drain terminal as a third transistor terminal 124 at its first mounting surface 108. The field effect transistor of the first semiconductor chip 106 is here embodied as an n-type MOSFET and forms a high-side switch of a half bridge constituted by the electronic device 100.

The second semiconductor chip 112 is configured as another semiconductor power chip and comprises a first mounting surface 114 bonded to the first substrate 102 and comprises a second mounting surface 116 bonded to the second substrate 104. The second semiconductor chip 112 comprises a further field effect transistor. This further field effect transistor comprises a gate terminal as a first transistor terminal 126, a source terminal as a second transistor terminal 128 at its first mounting surface 114 and a drain terminal as a third transistor terminal 130 at its second mounting surface 116. The further field effect transistor is here embodied as an n-type MOSFET and forms a low-side switch of the half bridge constituted by the electronic device 100.

The first substrate 102 embodied as leadframe has a plurality of electrically conductive connection elements 132 to 135 for electrically connecting the transistor terminals 120, 124, 126, 128 at the first mounting surfaces 108, 114 of the first semiconductor chip 106 and the second semiconductor chip 112, respectively. Connection element 132 is a low-side switch gate connection, connection element 133 is a ground connection, connection element 134 is an input voltage connection, connection element 135 is a high-side switch gate connection, and switch load contact 136 may be coupled to a load. The transistor terminals 122, 130 at the second mounting surfaces 110, 116 of the first semiconductor chip 106 and the second semiconductor chip 112 are connected electrically to one another by the electrically conductive second substrate 104.

The second substrate 104 embodied as an electrically and thermally conductive copper bonding clip is connected in a cantilever fashion to the first substrate 102 via connection arm 150.

Although not shown in FIG. 1, the electronic device 100 comprises a molding structure encapsulating the first semiconductor chip 106 and the second semiconductor chip 112 and partially or fully encapsulating the first substrate 102 and/or the second substrate 104. The mounting of the semiconductor chips 106, 112 between the substrates 102, 104 can be performed on wafer level. The molding can also be performed on wafer level. After that, the wafer package may be singularized into individual electronic chips 100 (for instance by sawing or punching).

In the plan view (perpendicular to the planar mounting surfaces 108, 110, 114, 116 of the semiconductor chips 106, 112) of FIG. 2, the second substrate 104 covers the entire second mounting surface 110 of the first semiconductor chip 106 and the entire second mounting surface 116 of the second semiconductor chip 112. Hence, the bonding clip constituting the second substrate 104 spans or covers the entire second mounting surface 110 of the first semiconductor chip 106 and spans or covers the entire second mounting surface 116 of the second semiconductor chip 112. The first substrate 102 configured as leadframe spans or extends also over the entire first mounting surface 108 of the first semiconductor chip 106 and the entire first mounting surface 114 of the second semiconductor chip 112. In other words, all exterior edges delimiting the first substrate 102 may extend beyond edges of the first semiconductor chip 106 and the second semiconductor chip 112. Thus, the circumferential edges of the semiconductor chips 106, 112 do not protrude laterally over the first substrate 102 in the described embodiment.

As can furthermore be taken from FIG. 2, the electronic device 100 comprises driving unit 200 mounted on the first substrate 102 and configured for driving the first semiconductor chip 106 and the second semiconductor chip 112 to perform a desired power switching operation. The driving unit 200 (which may be a processor in semiconductor technology) is electrically connected by a plurality of wire bonds 202 to the first semiconductor chip 106, to the second semiconductor chip 112, and to electrically conductive pads 204 for electrically connecting the electronic device 100 to an electronic periphery (not shown). The electrically conductive pads 204 can for instance be used as logic connections for a microcontroller.

Figure 3:
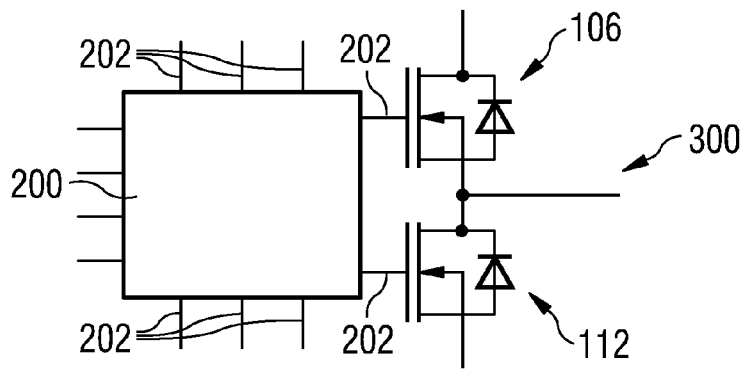
FIG. 3 shows an equivalent circuit of the electronic device of FIG. 1 and FIG. 2.

FIG. 3 shows an equivalent circuit of the electronic device 100 of FIG. 1 and FIG. 2. A load (not shown in FIG. 3) is to be connected to an output terminal 300.

Figure 4:
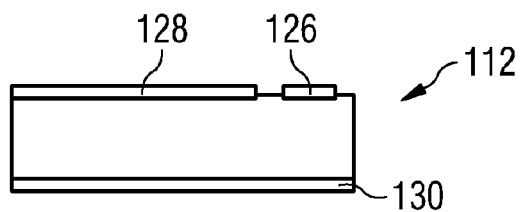
FIG. 4 shows a semiconductor chip having a transistor implemented therein configured as a low-side switch of the electronic circuit of FIG. 1.
Figure 5:
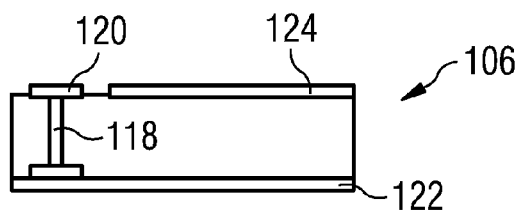
FIG. 5 shows a semiconductor chip having a transistor implemented therein configured as a high-side switch of the electronic circuit of FIG. 1.

FIG. 4 shows the semiconductor chip 112 configured as low-side switch of the electronic circuit 100 of FIG. 1. FIG. 5 shows the semiconductor chip 106 configured as high-side switch of the electronic circuit 100 of FIG. 1. As compared to the orientation of the switches in FIG. 4 and FIG. 5, both switches are flipped for mounting them in the electronic device 100 between the first substrate 102 and the second substrate 104.

During operation of the electronic device 100 embodied as a half bridge, the third transistor terminal 130 of the second semiconductor chip 112, operated as drain terminal, is operated as a high voltage contact to which a voltage in a range between 20 V and 2 kV, particularly in a range between 20 V and 200 V, can be present. The second transistor terminal 128 of the second semiconductor chip 112, operated as source terminal, is a low voltage contact, which for instance can be connected to ground. The first transistor terminal 126 of the second semiconductor chip 112, operated as gate terminal, is also a low voltage contact to which a voltage of several Volts (for instance 10 V) against ground can be applied during operation.

Figure 6:
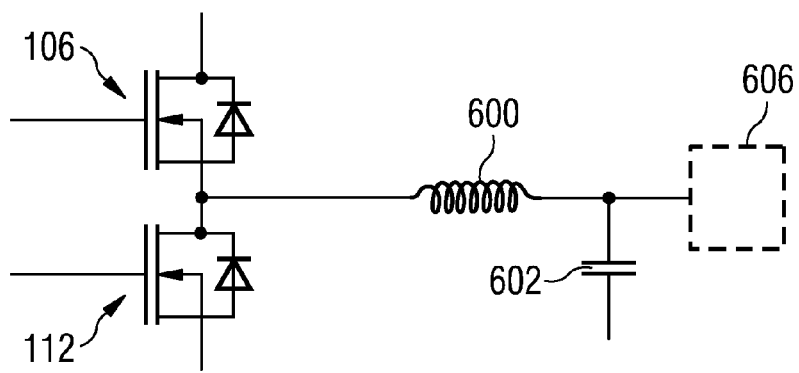
FIG. 6 is a schematic view of a half-bridge circuit with a load arranged downstream thereof.

FIG. 6 is a schematic view of a half-bridge circuit with a load 606 arranged downstream thereof.

An inductance 600 can serve as an energy storage member storing an amount of electric energy depending on the energy which load 606 draws. A capacitance 602 maintains the voltage level at a load-defined level (for instance 2.5 V to 40 V).

Figure 7:
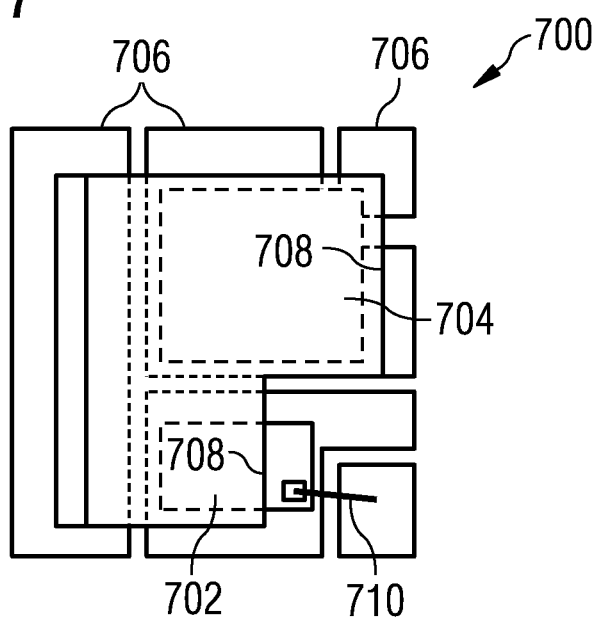
FIG. 7 shows a plan view of a conventional electronic device realizing the electronic function of the half bridge circuit of FIG. 6.

FIG. 7 shows a plan view of a conventional electronic device 700 realizing the electronic function of the half bridge circuit of FIG. 6.

In the plan view of FIG. 7, a first semiconductor chip 702 configured as a high-side switch and a second semiconductor chip 704 configured as a low-side switch of the half bridge are connected between a lead frame 706 and a bonding clip 708. Since the first semiconductor chip 702 is connected to the lead frame 706 by a wire bond 710, design rules may require that the bonding clip 708 may not cover the entire surface of the first semiconductor chip 702. This results from a limitation concerning a minimum die thickness because of wire bonds stress. Hence, there is a restriction concerning the top side of the electronic device 700 and therefore a restriction of the cooling area. Another design rule related limitation results from a required clearance between the bonding clip 708 and the wire bond 710. The limitation regarding the dimension of the first semiconductor chip 702 (also in terms of its contribution to the cooling of the electronic device 700 during operation) is particularly pronounced, since in the shown configuration the first semiconductor chip 702 has a smaller area than the second semiconductor chip 704. The reason for this is that the duty cycle between an active state of the respective semiconductor chip 702, 704 is so that the second semiconductor chip 704 (low-side switch) is longer (for instance 75% of the operation time) in the on-state than the first semiconductor chip 702 (high-side switch, for instance 25% of the operation time in the on-state).

Figure 8:
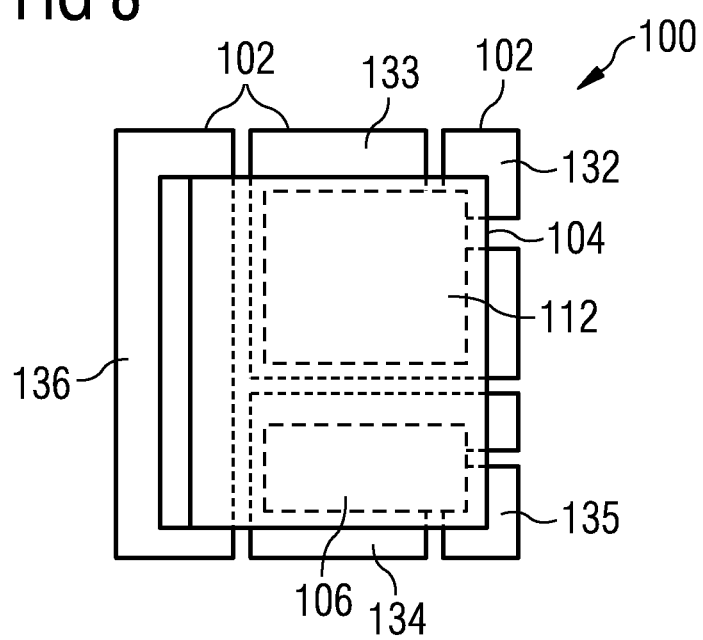
FIG. 8 shows a plan view of an electronic device according to an exemplary embodiment configured as a flip chip power stage and realizing the electronic function of the half bridge circuit of FIG. 6.

FIG. 8 shows a plan view of an electronic device 100 according to an exemplary embodiment configured as a flip chip power stage and realizing the electronic function of the half bridge circuit of FIG. 6 in an improved way compared to FIG. 7.

In this plan view perpendicular to the mounting surfaces 108, 110, 114, 116 of the semiconductor chips 106, 112, the bonding clip constituting the second substrate 104 covers the entire second mounting surface 110 of the first semiconductor chip 106 and the entire second mounting surface 116 of the second semiconductor chip 112. In comparison with FIG. 7, it is possible to increase the area of the first semiconductor chip 106 without violating design rules, since the wire bond 710 is now omitted and substituted by the via 118 (compare FIG. 1, not shown in FIG. 8). Therefore, the cooling performance of the electronic device 100 is significantly better than the cooling performance of the electronic device 700.

The flipped low-side switch in form of the second semiconductor chip 112, unlike the first semiconductor chip 106, does not comprise a via 118 and is contacted to switch load 606 via switch load contact 136. The high-side switch in form of the first semiconductor chip 106 is also contacted to the switch load 606 via switch load contact 136.

FIG. 9 to FIG. 16 show side views of different structures obtained during carrying out a method of manufacturing an electronic device 100 according to an exemplary embodiment.

Figure 9:
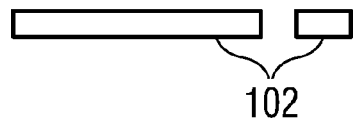
FIG. 9 to FIG. 16 show side views of different structures obtained during carrying out a method of manufacturing an electronic device according to an exemplary embodiment.

FIG. 9 shows a side view of the first substrate 102 embodied as lead frame.

Figure 10:
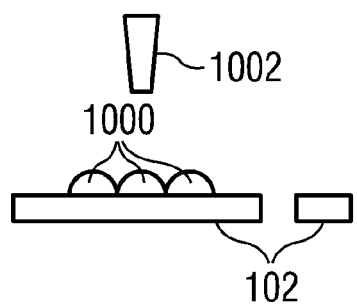

In order to obtain the structure shown in FIG. 10, dots 1000 of solder paste are applied on the first substrate 102 by a dispenser 1002.

Figure 11:
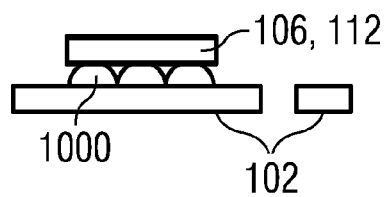

In order to obtain the structure shown in FIG. 11, the first semiconductor chip 106 and the second semiconductor chip 112 are bonded to the first substrate 102 by the solder dots 1000.

Figure 12:
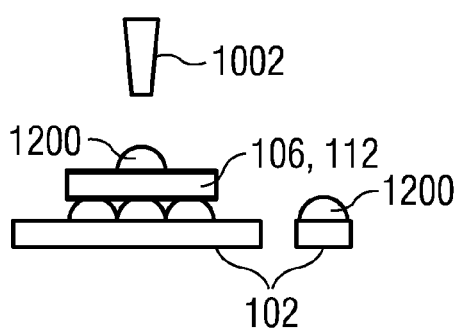

In order to obtain the structure shown in FIG. 12, additional dots 1200 of solder paste are applied on the first substrate 102, on the first semiconductor chip 106 and on the second semiconductor chip 112.

Figure 13:
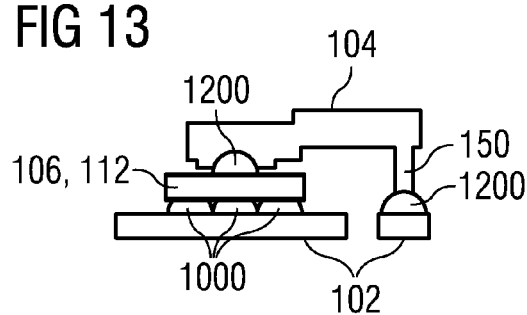

In order to obtain the structure shown in FIG. 13, the second substrate 104 in form of a bonding clip (embodied as a metal holder which can be used as a heat capacity for short-time cooling during operation of the ready-made electronic device 100) is connected via connection arm 150 and the solder dots 1200 to the first substrate 102, to the first semiconductor chip 106 and to the second semiconductor chip 112.

Figure 14:
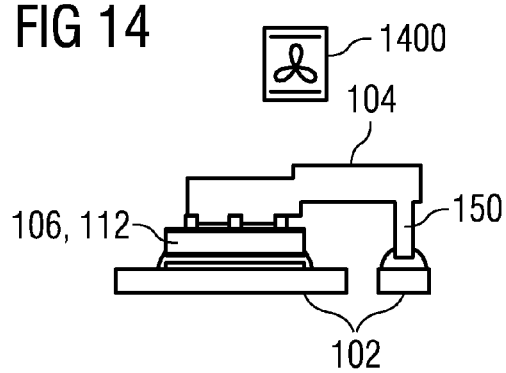

In order to obtain the structure shown in FIG. 14, the structure of FIG. 13 is tempered at an elevated temperature using a heater 1400 so that the solder material melts and the various components are connected to one another permanently. Intermetallic phases are formed, so that firmly bonded and electrically conductive connections are established.

Figure 15:
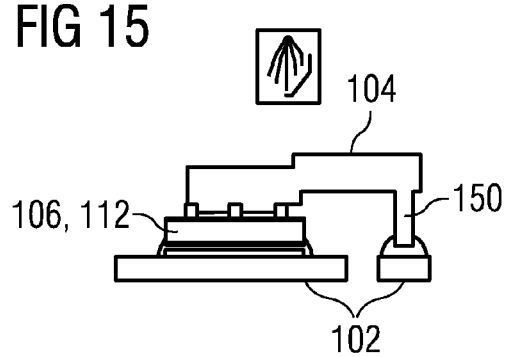

In order to obtain the structure shown in FIG. 15, the structure of FIG. 14 is cured.

Figure 16:
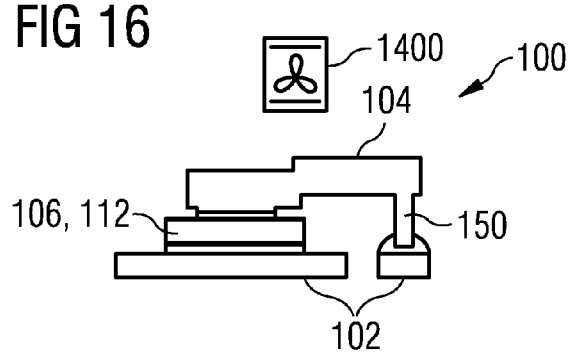

In order to obtain the structure shown in FIG. 16, the structure of FIG. 15 is tempered again at an elevated temperature by the heater 1400.

After an additional molding procedure for forming a molding structure (not shown), electronic device 100 according to an exemplary embodiment is obtained.

Figure 17:
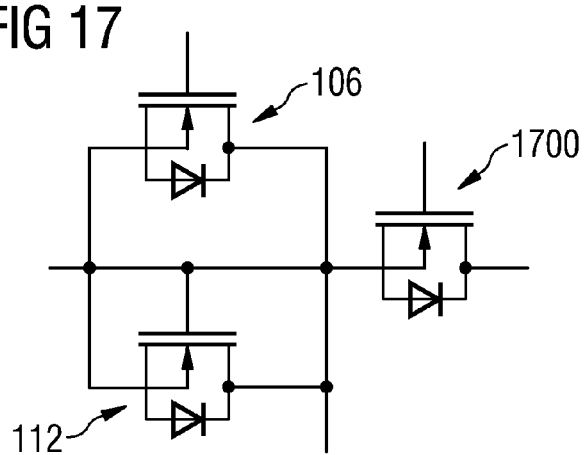
FIG. 17 is a schematic view of a cascaded power stage.

FIG. 17 is a schematic view of a cascaded power stage. To realize this cascaded power stage, a third semiconductor chip 1700 which is embodied as a further low-side switch is implemented in addition to the semiconductor chips 106, 112.

Figure 18:
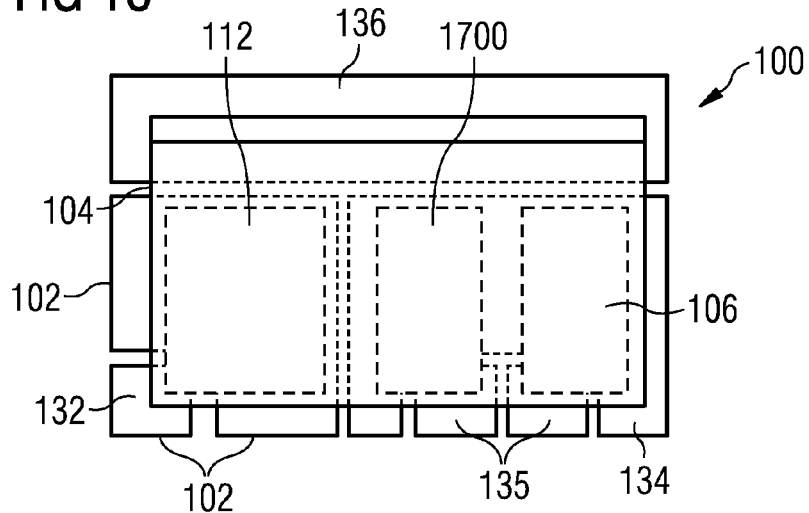
FIG. 18 shows a plan view of an electronic device according to an exemplary embodiment configured as a flip chip power stage and realizing the electronic function of the cascaded power stage circuit of FIG. 17.

FIG. 18 shows a plan view of an electronic device 100 according to an exemplary embodiment configured as a flip chip power stage and realizing the electronic function of the cascaded power stage circuit of FIG. 17. The electronic device further comprises, in comparison to FIG. 1, third semiconductor chip 1700 comprising a first mounting surface bonded to the first substrate 102 and comprising a second mounting surface bonded to the second substrate 106. Both low-side switches (compare semiconductor chips 112, 1700) and the high-side switch (compare semiconductor chip 106) are flipped (i.e. have two transistor terminals on the bottom side), and only the high-side switch comprises a via 118 for connecting its gate to its source.

Hence, besides the above-mentioned opportunity of an increased chip size for the first semiconductor chip 106 as high-side switch, the described package concept of a common clip as second substrate 104 can be also used for the constitution of more complex circuitries like a cascaded power stage, i.e. a half bridge with one high-side switch and two low-side switches.

Figure 19:
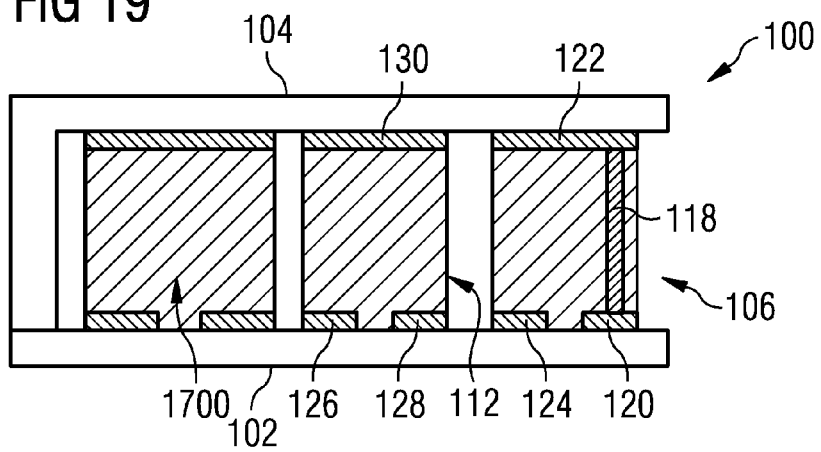
FIG. 19 shows a schematic side view of the electronic device of FIG. 18.

FIG. 19 shows a side view of the electronic device 100 of FIG. 18 in a schematic illustration in which three semiconductor chips 106, 112, 1700 are connected between a lead frame as the first substrate 102 and a bonding clip as the second substrate 104.

Figure 20:
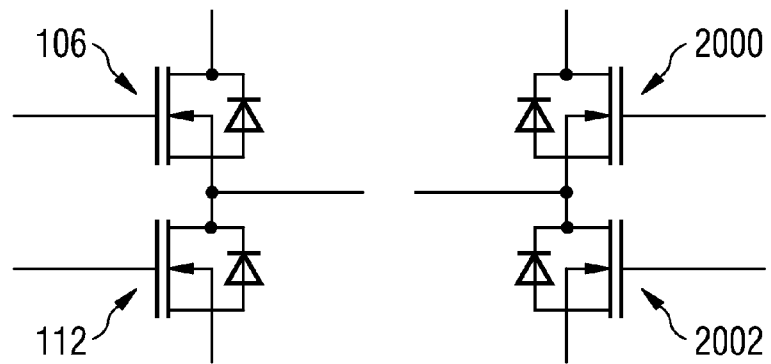
FIG. 20 is a schematic view of an H-bridge.
Figure 21:
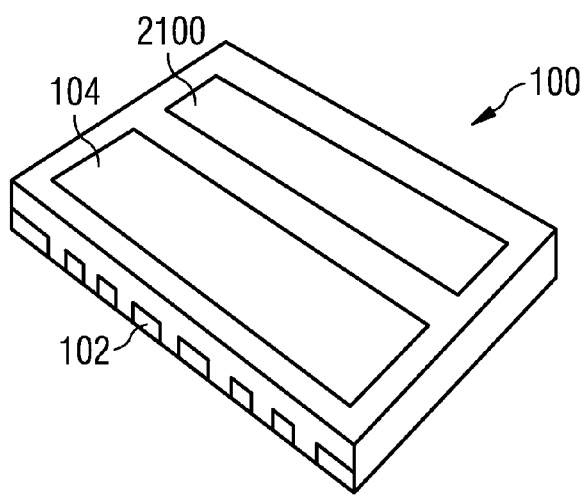
FIG. 21 to FIG. 24 show different three-dimensional views of an electronic device according to an exemplary embodiment configured as a flip chip power stage and realizing the electronic function of the H-bridge circuit of FIG. 20.
Figure 22:
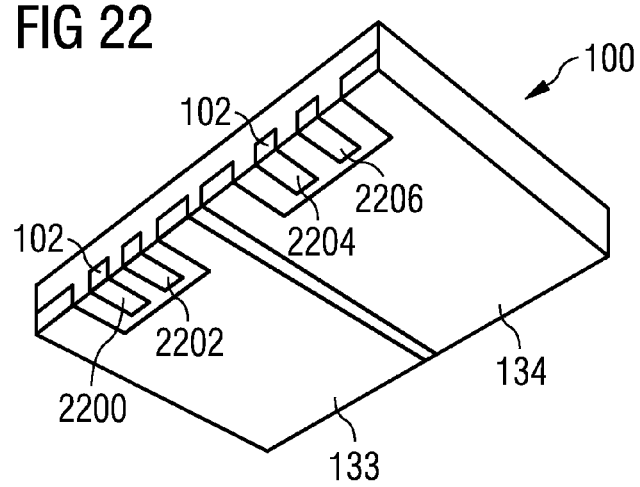
Figure 23:
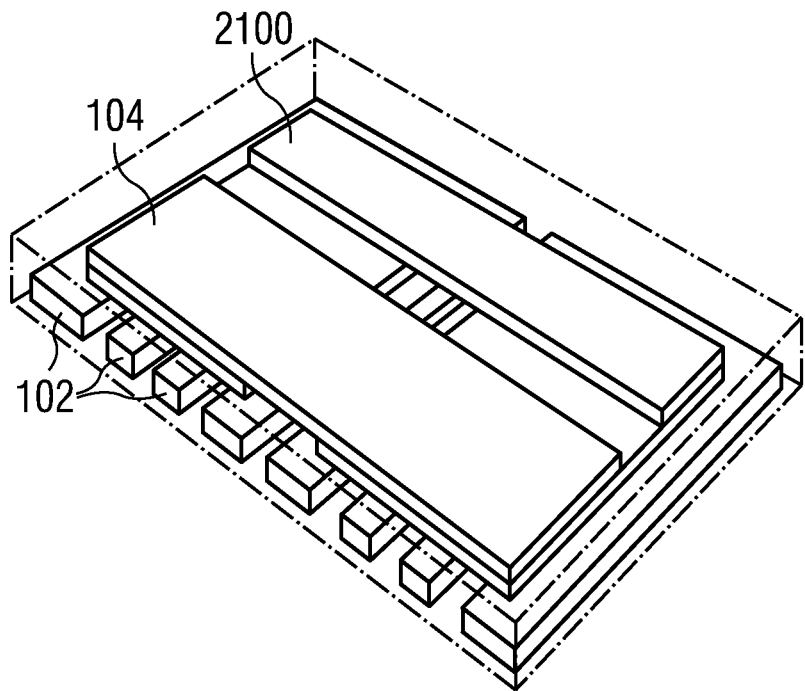
Figure 24:
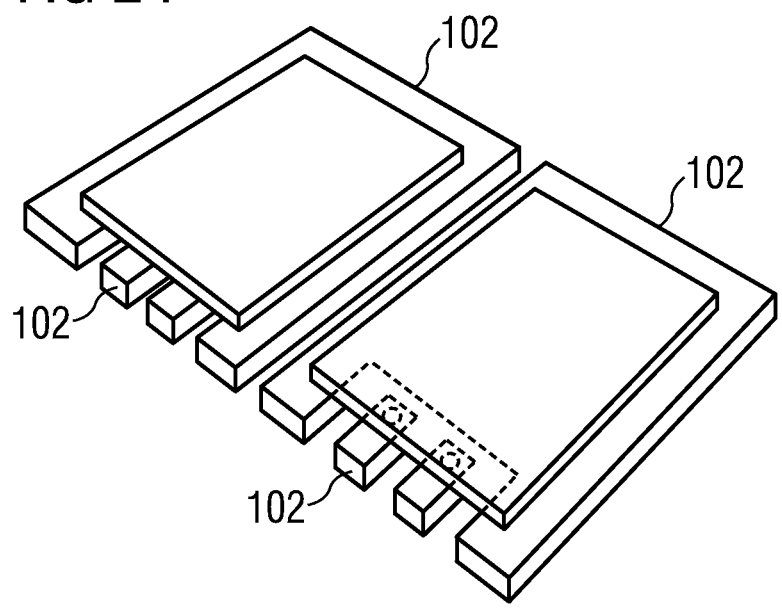

FIG. 20 is a schematic view of an H-bridge.

The H-bridge of FIG. 20 is an example of a multi half bridge, i.e. a combination of two half bridges, in addition to package top-side contact, which can be used for a direct contact to an application like drives or a DC/DC conversion.

FIG. 21 to FIG. 24 show different three-dimensional views of an electronic device 100 according to an exemplary embodiment configured as a flip chip power stage and realizing the electronic function of the H-bridge circuit of FIG. 20.

The electronic device 100 comprises, in addition to the first substrate 102 (embodied as a lead frame) and the second substrate 104 (in the present embodiment also embodied as a lead frame), a third substrate 2100 (also embodied as a lead frame), a third semiconductor chip 2000 comprising a first mounting surface bonded to the first substrate 102 and comprising a second mounting surface bonded to the third substrate 2100, and a fourth semiconductor chip 2002 comprising a first mounting surface bonded to the first substrate 102 and comprising a second mounting surface bonded to the third substrate 2100. The third semiconductor chip 2000 may be configured as the first semiconductor chip 106 (i.e. as a high-side switch with a via 118), and the fourth semiconductor chip 2002 may be configured as the second semiconductor chip 112 (i.e. as a low-side switch without a via 118). Altogether, four gate connections are provided, denoted by reference numerals 2200, 2202, 2204, 2206.

Figure 25:
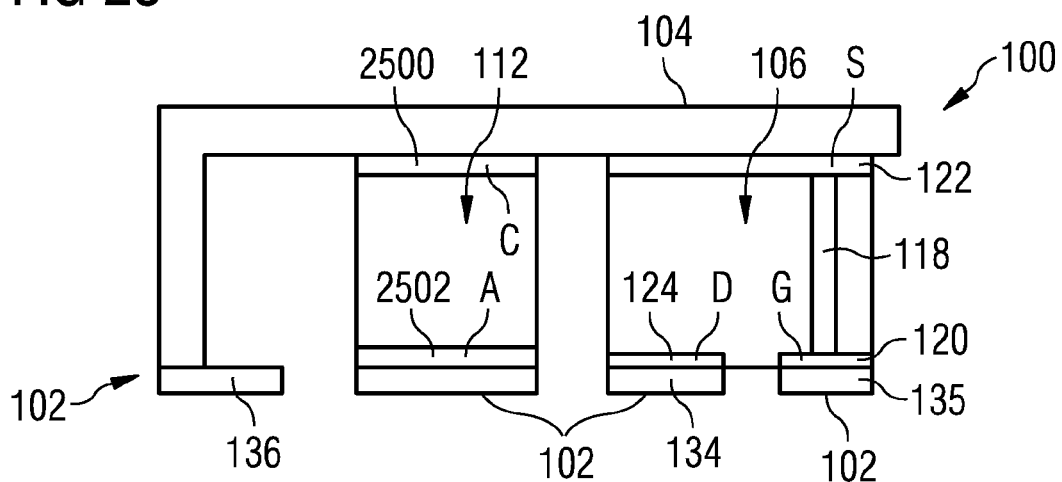
FIG. 25 shows a side view of an electronic device according to an exemplary embodiment in which a first semiconductor chip implementing a high-side transistor switch and a second semiconductor chip implementing a diode are connected between a lead frame as a first substrate and a bonding clip as a second substrate.

FIG. 25 shows a side view of an electronic device 100 according to an exemplary embodiment in which a first semiconductor chip 106 implementing a high-side transistor switch and a second semiconductor chip 112 implementing a diode are connected between a lead frame as a first substrate 102 and a bonding clip as a second substrate 104.

In the diode-comprising second semiconductor chip 112, an anode terminal 2502 of the diode is bonded to the first substrate 102 and a cathode terminal 2500 of the diode is bonded to the second substrate 104.

Compared to the embodiment of FIG. 1, the embodiment of FIG. 25 uses a diode instead of a transistor-based low-side switch. Such a diode may substitute the switching performance of a field effect transistor in terms of asynchronous rectification.

Figure 26:
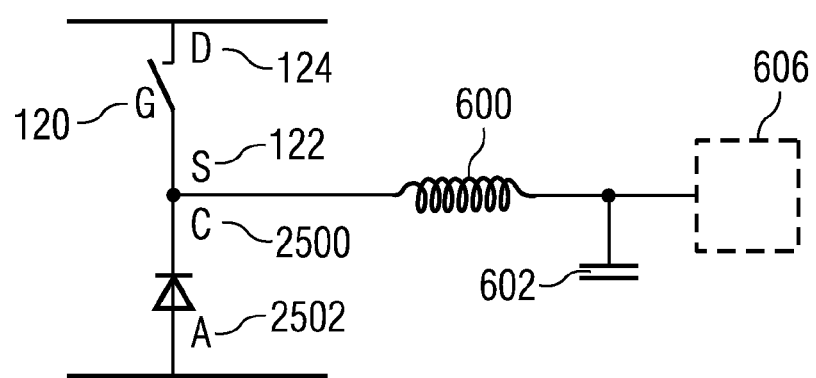
FIG. 26 shows an equivalent circuit of the electronic device of FIG. 25.

FIG. 26 shows an equivalent circuit of the electronic device 100 of FIG. 25, compare also FIG. 6.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:
1. An electronic device, comprising:
a first substrate;
a second substrate;
a first semiconductor chip comprising a transistor, a first mounting surface bonded to the first substrate and a second mounting surface bonded to the second substrate;
a second semiconductor chip comprising a first mounting surface bonded to the first substrate and comprising a second mounting surface bonded to the second substrate;
wherein the first semiconductor chip comprises a via electrically coupling a first transistor terminal at its first mounting surface with a second transistor terminal at its second mounting surface.
2. The device according to claim 1, wherein the first semiconductor chip comprises a third transistor terminal at its first mounting surface.
3. The device according to claim 2, wherein the first transistor terminal is a gate terminal, the second transistor terminal is a first source/drain terminal, and the third transistor terminal is a second source/drain terminal.

4. The device according to claim 1, wherein the second semiconductor chip comprises a further transistor.

5. The device according to claim 4, wherein the further transistor comprises a first transistor terminal and a second transistor terminal at its first mounting surface and a third transistor terminal at its second mounting surface.

6. The device according to claim 5, wherein the first transistor terminal of the further transistor is a gate terminal, the second transistor terminal of the further transistor is a first source/drain terminal, and the third transistor terminal of the further transistor is a second source/drain terminal.

7. The device according to claim 1, wherein the second semiconductor chip comprises a diode having a cathode and an anode.

8. The device according to claim 1, wherein the electronic device is configured as a half bridge in which the transistor is configured as high-side switch and the second semiconductor chip comprises an assigned low side switch.

9. The device according to claim 1, wherein the first substrate comprises a leadframe having a plurality of electrically conductive connection elements for electrically connecting the first mounting surface of the first semiconductor chip and the first mounting surface of the second semiconductor chip.

10. The device according to claim 1, wherein the second substrate is a bonding clip, in particular a bonding clip connected in a cantilever fashion to the first substrate.

11. The device according to claim 10, wherein the bonding clip is made of a thermally conductive and electrically conductive material.

12. The device according to claim 10, wherein the bonding clip covers the entire second mounting surface of the first semiconductor chip and covers the entire second mounting surface of the second semiconductor chip.

13. The device according to claim 1, comprising a driving unit mounted on the first substrate and configured for driving at least one of the first semiconductor chip and the second semiconductor chip.

14. The device according to claim 1, configured as at least one of the group consisting of a half bridge, a cascaded power stage, a multi-half bridge, an H-bridge, and an electric engine controller.

15. An electronic power device, comprising:
a first substrate
a second substrate;
a first semiconductor power chip comprising a first transistor, a first mounting surface with two transistor terminals bonded to the first substrate and a second mounting surface with one transistor terminal bonded to the second substrate;
a second semiconductor power chip comprising a second transistor, a first mounting surface with two transistor terminals bonded to the first substrate and a second mounting surface with one transistor terminal bonded to the second substrate;
wherein, in a plan view perpendicular to the mounting surfaces, the second substrate covers the entire second mounting surface of the first semiconductor power chip and the entire second mounting surface of the second semiconductor power chip.

16. The device according to claim 15, wherein the second substrate is a bonding clip.

17. The device according to claim 15, wherein the first semiconductor power chip comprises a via extending through the first semiconductor power chip perpendicular to the mounting surfaces and electrically coupling one of the transistor terminals at its first mounting surface with the transistor terminal at its second mounting surface.

18. The device according to claim 17, wherein the transistor terminal at the first mounting surface coupled by the via is a gate terminal, and wherein the transistor terminal at the second mounting surface coupled by the via is a source/drain terminal.

19. The device according to claim 15, wherein the semiconductor power chips are connected to one another to form a half bridge.

20. A method of manufacturing an electronic device, wherein the method comprises:
bonding a first mounting surface of a first semiconductor chip to a first substrate;
bonding a first mounting surface of a second semiconductor chip to the first substrate;
bonding a second mounting surface of the first semiconductor chip to a second substrate;
bonding a second mounting surface of the second semiconductor chip to the second substrate;
forming a via extending through the first semiconductor chip for electrically coupling a first transistor terminal at its first mounting surface with a second transistor terminal at its second mounting surface.

* * * * *